United States Patent
Bellorado et al.

(10) Patent No.: US 10,665,256 B2
(45) Date of Patent: May 26, 2020

(54) HYBRID TIMING RECOVERY

(71) Applicant: Seagate Technology LLC, Cupertino, CA (US)

(72) Inventors: Jason Bellorado, San Jose, CA (US); Marcus Marrow, San Jose, CA (US); Zheng Wu, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 333 days.

(21) Appl. No.: 15/791,190

(22) Filed: Oct. 23, 2017

(65) Prior Publication Data

US 2018/0366155 A1 Dec. 20, 2018

Related U.S. Application Data

(60) Provisional application No. 62/522,248, filed on Jun. 20, 2017.

(51) Int. Cl.
  *G11B 5/596* (2006.01)
  *G11B 20/10* (2006.01)
  (Continued)

(52) U.S. Cl.
  CPC ...... *G11B 5/59666* (2013.01); *G11B 5/59633* (2013.01); *G11B 20/1024* (2013.01); *G11B 20/10037* (2013.01); *G11B 20/10055* (2013.01); *G11B 20/10222* (2013.01); *H03K 5/131* (2013.01); *H03K 5/135* (2013.01); *H03L 7/07* (2013.01); *H03L 7/0814* (2013.01); *H03L 7/091* (2013.01); *H03M 1/001* (2013.01); *H03M 13/4146* (2013.01); *H04L 25/03019* (2013.01); *H03K 2005/00019* (2013.01); *H03M 13/2951* (2013.01); *H04B 1/71055* (2013.01);
  (Continued)

(58) Field of Classification Search
  None
  See application file for complete search history.

(56) References Cited

U.S. PATENT DOCUMENTS 5,321,564 A   6/1994  Takahashi
5,461,644 A  10/1995  Bermans et al.
(Continued)

OTHER PUBLICATIONS

Bellorado et al., "Target Parameter Adaptation", U.S. Appl. No. 15/334,167, filed Oct. 25, 2016, Seagate Technology LLC.
(Continued)

*Primary Examiner* — Cassandra F Cox
(74) *Attorney, Agent, or Firm* — Setter Roche LLP; Kirk A Cesari

(57) ABSTRACT

An apparatus may include a circuit configured to receive a first phase control value of a phase control value signal, generate a first phase interpolator control signal value of a phase interpolator control signal and generate a first digital interpolator control signal value of a digital interpolator control signal. The apparatus may further be configured to phase interpolate a clock signal based on the first phase interpolator control signal value to produce a phase shifted clock signal and digitally interpolate a digital sample based on the first digital interpolator signal value to produce a phase shifted digital sample having an effective phase based on the first phase control value, the digital sample generated using the phase shifted clock signal as a sample clock.

20 Claims, 6 Drawing Sheets

(51) Int. Cl.
*H04L 25/03* (2006.01)
*H03K 5/131* (2014.01)
*H03M 1/00* (2006.01)
*H03M 13/41* (2006.01)
*H03K 5/135* (2006.01)
*H03L 7/07* (2006.01)
*H03L 7/081* (2006.01)
*H03L 7/091* (2006.01)
*H04L 7/00* (2006.01)
*H03M 13/29* (2006.01)
*H04B 1/7105* (2011.01)
*H03K 5/00* (2006.01)
*H04L 7/033* (2006.01)

(52) U.S. Cl.
CPC .......... *H04L 7/0025* (2013.01); *H04L 7/0029* (2013.01); *H04L 7/0331* (2013.01)

(56) References Cited

U.S. PATENT DOCUMENTS

| | | |
|---|---|---|
| 5,543,978 A | 8/1996 | Park |
| 5,621,769 A | 4/1997 | Wan et al. |
| 5,654,765 A | 8/1997 | Kim |
| 5,742,532 A | 4/1998 | Duyne et al. |
| 5,862,192 A | 1/1999 | Huszar et al. |
| 5,970,093 A | 10/1999 | Lantremange |
| 6,111,712 A | 8/2000 | Vishakhadatta et al. |
| 6,157,510 A | 12/2000 | Schreck et al. |
| 6,181,213 B1 | 1/2001 | Chang |
| 6,222,592 B1 | 4/2001 | Patel |
| 6,320,920 B1 | 11/2001 | Beyke |
| 6,377,552 B1 | 4/2002 | Moran et al. |
| 6,396,887 B1 | 5/2002 | Ware et al. |
| 6,438,185 B1 | 8/2002 | Huttunen |
| 6,505,222 B1 | 1/2003 | Davis et al. |
| 6,519,107 B1 | 2/2003 | Ehrlich et al. |
| 6,549,587 B1 | 4/2003 | Li |
| 6,580,676 B1 | 6/2003 | Yanagisawa et al. |
| 6,581,182 B1 | 6/2003 | Lee |
| 6,633,894 B1 | 10/2003 | Cole |
| 6,665,308 B1 | 12/2003 | Rakib et al. |
| 6,670,901 B2 | 12/2003 | Brueske et al. |
| 6,687,073 B1 | 2/2004 | Kupferman |
| 6,697,891 B2 | 2/2004 | Emberty et al. |
| 6,707,772 B1 | 3/2004 | Marrec et al. |
| 6,738,205 B1 | 5/2004 | Moran et al. |
| 6,738,215 B2 | 5/2004 | Yatsu |
| 6,950,258 B2 | 9/2005 | Takaishi |
| 6,993,291 B1 | 1/2006 | Parssinen et al. |
| 7,046,701 B2 | 5/2006 | Mohseni et al. |
| 7,085,330 B1 | 8/2006 | Shirali |
| 7,133,233 B1 | 11/2006 | Ray et al. |
| 7,133,239 B1 | 11/2006 | Hartman et al. |
| 7,245,448 B2 | 7/2007 | Urata |
| 7,298,573 B2 | 11/2007 | Kitamura |
| 7,324,437 B1 | 1/2008 | Czylwik et al. |
| 7,362,432 B2 | 4/2008 | Roth |
| 7,440,208 B1 | 10/2008 | McEwen et al. |
| 7,929,238 B1 | 4/2011 | Vasquez |
| 7,940,667 B1 | 5/2011 | Coady |
| 7,948,703 B1 | 5/2011 | Yang |
| 8,027,117 B1 | 9/2011 | Sutardja et al. |
| 8,139,301 B1 | 3/2012 | Li et al. |
| 8,160,181 B1 | 4/2012 | Song et al. |
| 8,172,755 B2 | 5/2012 | Song et al. |
| 8,296,637 B1 | 10/2012 | Varnica et al. |
| 8,400,726 B1 | 3/2013 | Wu et al. |
| 8,456,977 B2 | 6/2013 | Honma |
| 8,479,086 B2 | 7/2013 | Xia et al. |
| 8,514,506 B1 | 8/2013 | Li et al. |
| 8,539,328 B2 | 9/2013 | Jin et al. |
| 8,542,766 B2 | 9/2013 | Chekhovstov et al. |
| 8,543,894 B1 | 9/2013 | Varnica et al. |
| 8,713,413 B1 | 4/2014 | Bellorado et al. |
| 8,724,245 B1 | 5/2014 | Smith et al. |
| 8,755,139 B1 | 6/2014 | Zou et al. |
| 8,760,794 B1 | 6/2014 | Coker et al. |
| 8,767,341 B1 | 7/2014 | Coker et al. |
| 8,780,477 B1 | 7/2014 | Guo et al. |
| 8,837,068 B1 | 9/2014 | Liao et al. |
| 8,861,111 B1 | 10/2014 | Liao et al. |
| 8,861,112 B1 | 10/2014 | Pan et al. |
| 8,887,033 B1 | 11/2014 | Varnica et al. |
| 8,953,276 B1 | 2/2015 | Pokharel et al. |
| 9,007,707 B1 | 4/2015 | Lu et al. |
| 9,019,642 B1 | 4/2015 | Xia et al. |
| 9,025,269 B1 | 5/2015 | Wong et al. |
| 9,064,537 B1 | 6/2015 | Nie et al. |
| 9,082,418 B2 | 7/2015 | Ong et al. |
| 9,093,115 B1 | 7/2015 | Fung et al. |
| 9,099,132 B1 | 8/2015 | Grundvig et al. |
| 9,129,650 B2 | 9/2015 | Mathew et al. |
| 9,147,416 B2 | 9/2015 | Grundvig et al. |
| 9,189,315 B1 | 11/2015 | Varnica et al. |
| 9,196,298 B1 | 11/2015 | Zhang et al. |
| 9,245,578 B1 | 1/2016 | Wang et al. |
| 9,245,579 B2 | 1/2016 | Song et al. |
| 9,245,580 B1 | 1/2016 | Lu et al. |
| 9,246,668 B1 * | 1/2016 | Yu .................. H04L 7/0029 |
| 9,257,135 B2 | 2/2016 | Ong et al. |
| 9,257,145 B1 | 2/2016 | Soderbloom et al. |
| 9,286,915 B1 | 3/2016 | Dziak et al. |
| 9,311,937 B2 | 4/2016 | Zou et al. |
| 9,311,959 B1 | 4/2016 | Fan |
| 9,385,757 B1 | 7/2016 | Nangare |
| 9,401,161 B1 | 7/2016 | Jury et al. |
| 9,424,878 B1 | 8/2016 | Dziak et al. |
| 9,431,052 B2 | 8/2016 | Oberg et al. |
| 9,489,976 B2 | 11/2016 | Jury et al. |
| 9,508,369 B2 | 11/2016 | Chu et al. |
| 9,536,563 B1 | 1/2017 | Liu et al. |
| 9,542,972 B1 | 1/2017 | Nayak et al. |
| 9,564,157 B1 | 2/2017 | Trantham |
| 9,590,803 B2 | 3/2017 | Derras et al. |
| 9,645,763 B2 | 5/2017 | Sankaranarayanan et al. |
| 9,672,850 B2 | 6/2017 | Grundvig et al. |
| 9,728,221 B2 | 8/2017 | Oberg et al. |
| 9,947,362 B1 | 4/2018 | Venkataramani et al. |
| 9,998,136 B1 * | 6/2018 | Wu .................. G11B 20/10037 |
| 10,014,026 B1 | 7/2018 | Wu et al. |
| 10,152,457 B1 | 12/2018 | Bellorado |
| 10,164,760 B1 * | 12/2018 | Bellorado ........ G11B 20/10222 |
| 10,177,771 B1 | 1/2019 | Bellorado et al. |
| 10,180,868 B2 | 1/2019 | Alhussien et al. |
| 10,276,233 B1 | 4/2019 | Danjean et al. |
| 10,297,281 B1 | 5/2019 | Bellorado et al. |
| 10,469,290 B1 | 11/2019 | Marrow et al. |
| 10,498,565 B1 | 12/2019 | Azenkot et al. |
| 2002/0080898 A1 * | 6/2002 | Agazzi ............... H03M 1/0624 375/355 |
| 2002/0181439 A1 | 12/2002 | Orihashi et al. |
| 2003/0185114 A1 | 10/2003 | Liaw |
| 2003/0198152 A1 | 10/2003 | Morishima |
| 2003/0198165 A1 | 10/2003 | Mouri et al. |
| 2004/0101068 A1 | 5/2004 | Wang et al. |
| 2004/0228397 A1 | 11/2004 | Bach |
| 2005/0117243 A1 | 6/2005 | Serizawa |
| 2005/0270687 A1 | 12/2005 | Zweighaft |
| 2006/0215290 A1 | 9/2006 | Kurtas et al. |
| 2007/0139805 A1 | 6/2007 | Mead |
| 2007/0139806 A1 | 6/2007 | Southerland et al. |
| 2007/0177292 A1 | 8/2007 | Bui et al. |
| 2008/0007855 A1 | 1/2008 | Vityaev et al. |
| 2008/0158711 A1 | 7/2008 | Bliss et al. |
| 2008/0175309 A1 | 7/2008 | Fimoff et al. |
| 2009/0028252 A1 | 1/2009 | Lu |
| 2009/0097606 A1 * | 4/2009 | Hutchins ................ H03L 7/07 375/376 |
| 2009/0141386 A1 | 6/2009 | Miura |
| 2009/0262870 A1 | 10/2009 | Ashbrook et al. |
| 2009/0323214 A1 | 12/2009 | Grundvig et al. |
| 2010/0290153 A1 | 11/2010 | Hampshire |

(56) References Cited

U.S. PATENT DOCUMENTS

| | | |
|---|---|---|
| 2011/0002375 A1 | 1/2011 | Honma |
| 2011/0072335 A1 | 3/2011 | Liu et al. |
| 2011/0090773 A1 | 4/2011 | Yu et al. |
| 2011/0176400 A1 | 7/2011 | Gerasimov |
| 2012/0082018 A1 | 4/2012 | Gushima |
| 2012/0105994 A1 | 5/2012 | Bellorado et al. |
| 2012/0155577 A1 | 6/2012 | Shukla et al. |
| 2013/0076433 A1 | 3/2013 | Fratti |
| 2013/0201838 A1 | 8/2013 | Homchaudhuri et al. |
| 2014/0009192 A1 | 1/2014 | Suzuki |
| 2014/0035638 A1 | 2/2014 | Bode |
| 2014/0223114 A1 | 8/2014 | Wang et al. |
| 2015/0003221 A1 | 1/2015 | Sankaranarayanan et al. |
| 2015/0022916 A1 | 1/2015 | Zou et al. |
| 2015/0279398 A1 | 10/2015 | Fan et al. |
| 2015/0355838 A1 | 12/2015 | Chen et al. |
| 2015/0380048 A1 | 12/2015 | Oberg et al. |
| 2016/0019921 A1 | 1/2016 | Bui et al. |
| 2016/0112218 A1 | 4/2016 | Abe |
| 2016/0293205 A1 | 10/2016 | Jury et al. |
| 2016/0351227 A1 | 12/2016 | Koshino |
| 2017/0125089 A1 | 5/2017 | Sankaranarayanan et al. |
| 2017/0125110 A1 | 5/2017 | Sankaranarayanan et al. |
| 2017/0236592 A1 | 8/2017 | Alhussien et al. |
| 2017/0249206 A1 | 8/2017 | Jeong et al. |
| 2018/0011753 A1 | 1/2018 | Alhussien et al. |
| 2018/0012663 A1 | 1/2018 | Alhussien et al. |
| 2018/0277158 A1 | 9/2018 | Kishino |
| 2018/0367164 A1 | 12/2018 | Marrow et al. |
| 2019/0130967 A1 | 5/2019 | Danjean et al. |
| 2020/0065262 A1 | 2/2020 | Bellorado |

OTHER PUBLICATIONS

Guo, Yuanbin, "An Efficient Circulant MIMO Equalizer for CDMA Downlink: Algorithm and VLSI Architecture", Hindawi Publishing Corporation, 2006, pp. 1-18.

Hicks, James, "Overloaded Array Processing with Spatially Reduced Search Joint Detection", Virginia Polytechnic Institute & State University, May 10, 2000, pp. 1-144.

Mohammad, Maruf, "Blind Acquisition of Short Burst with Per-Survivor Processing (PSP)", Virginia Polytechnic Institute & State University, Nov. 26, 2002, pp. 1-127.

Nechaev, Y. B., et al., "Increasing Efficiency of Information Transmission with Interference Influence by the Use of Multi-Parameter Adaptation", East-West Design & Test Symposium (EWDTS 2013), Rostov-on-Don, 2013, pp. 1-4 (Year: 2013).

\* cited by examiner

HYBRID TIMING RECOVERY

SUMMARY

In certain embodiments, an apparatus may include a circuit configured to receive a first phase control value of a phase control value signal, generate a first phase interpolator control signal value of a phase interpolator control signal and generate a first digital interpolator control signal value of a digital interpolator control signal. The apparatus may further be configured to phase interpolate a clock signal based on the first phase interpolator control signal value to produce a phase shifted clock signal and digitally interpolate a digital sample based on the first digital interpolator signal value to produce a phase shifted digital sample having an effective phase based on the first phase control value, the digital sample generated using the phase shifted clock signal as a sample clock.

In certain embodiments, a system may include a timing control circuit configured to receive a first phase control value of a phase control signal, generate a phase interpolator control signal based on the phase control signal and generate a first digital interpolator control signal value of a digital interpolator control signal based on the phase control signal. The system may further include a phase interpolator that phase interpolates a clock signal based on the phase interpolator control signal to produce a phase shifted clock signal and a digital interpolator that digitally interpolates digital samples based on the digital interpolator signal to produce phase shifted digital samples; a first digital sample of the digital samples being interpolated based on a first digital interpolator control value of the digital interpolator control signal to produce a first phase shifted digital sample having an effective phase based on the first phase control value, the digital samples being generated using the phase shifted clock signal as a sample clock.

In certain embodiments, a method may include receiving, by a timing control circuit, a first phase control value of a phase control value signal, generating, by the timing control circuit, a first phase interpolator control signal value of a phase interpolator control signal, and generating, by the timing control circuit, a first digital interpolator control signal value of a digital interpolator control signal. The method may further include phase interpolating a clock signal based on the first phase interpolator control signal value to produce a phase shifted clock signal and digitally interpolating a digital sample based on the first digital interpolator signal to produce a phase shifted digital sample having an effective phase based on the first phase control value, the digital sample generated using the phase shifted clock signal as a sample clock.

DETAILED DESCRIPTION

Figure 1:
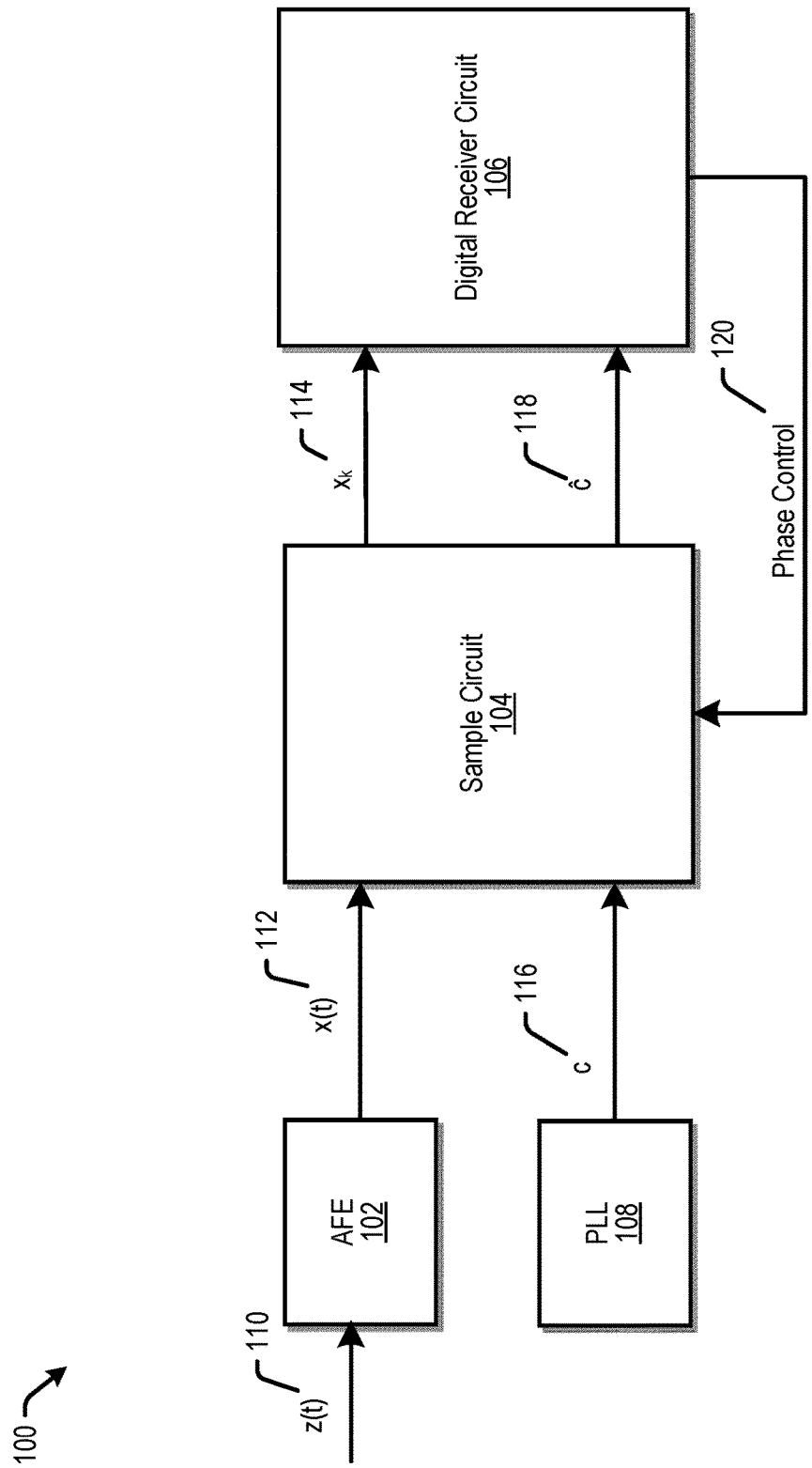
FIG. 1 is a block diagram of a communication channel which may include hybrid timing recovery functionality, in accordance with certain embodiments of the present disclosure.

In the following detailed description of the embodiments, reference is made to the accompanying drawings which form a part hereof, and in which are shown by way of illustrations. It is to be understood that features of the various described embodiments may be combined, other embodiments may be utilized, and structural changes may be made without departing from the scope of the present disclosure. It is also to be understood that features of the various embodiments and examples herein can be combined, exchanged, or removed without departing from the scope of the present disclosure.

In accordance with various embodiments, the methods and functions described herein may be implemented as one or more software programs running on a computer processor or controller. In accordance with another embodiment, the methods and functions described herein may be implemented as one or more software programs running on a computing device, such as a personal computer that is using a disc drive. Dedicated hardware implementations including, but not limited to, application specific integrated circuits, programmable logic arrays, and other hardware devices can likewise be constructed to implement the methods and functions described herein. Further, the methods described herein may be implemented as a computer readable storage medium or device including instructions that when executed cause a processor to perform the methods.

The present disclosure generally relates to synchronous digital systems, and in some embodiments, the present disclosure may relate to a hybrid timing recovery approach incorporating both a clock-controlled timing recovery and an interpolated timing recovery.

Some systems, such as electrical, electronic, motor drive, processing, or other systems may receive a signal of interest and process that signal. For example, a read channel of a communication system or a magnetic recording storage system may receive an analog input signal and sample the input signal to generate a digitized sample. In some systems, the sampling of the digitized signal may be synchronized to a phase of the input signal before being applied to a digital receiver. For example, the digital receiver may be a detector, a decoder, a filter or other digital system.

As mentioned above, some embodiments may include hybrid timing recovery components which may incorporate both clock-controlled timing recovery functionality and interpolated timing recovery functionality.

In some examples, clock-controlled timing recovery functionality may shift the phase of a clock signal to generate a phase shifted clock signal based on a phase control value. The phase shifted clock signal may then be used for both sampling (e.g. by an analog-to-digital converter (ADC)) and for clocking the logic of the digital receiver. The phase control value may be an estimate of the deviation of the phase of the clock signal from a target phase. The phase shifting of the clock signal may operate to shift the phase of the clock signal by a phase step size (e.g. on a per sample basis or on a per multiple sample basis) when the phase control value is greater than the phase step size. In some embodiments, the phase step size or step size may be a maximum value to which the magnitude of instantaneous change of the sampling clock phase is limited. The phase step size may be selected so as to adhere to a minimum length clock cycle when closing timing on digital logic. If a desired change in clock phase exceeds this value, then it may be realized by adjusting the phase over multiple cycles, where each change (or step) in clock phase does not exceed the specified maximum value.

In addition, the interpolated timing recovery functionality may conduct phase adjustments digitally (e.g. using an interpolation filter) on the samples generated using the phase shifted clock signal. For example, when the phase control value is greater than the phase step size, the interpolated timing recovery functionality may perform phase adjustment of the samples for the amount the phase control value exceeds the phase step size.

An example of such a system is discussed below with regard to FIG. 1.

Referring to FIG. 1, a block diagram of a communication channel which may include hybrid timing recovery functionality is shown and is generally designated 100. System 100 can include an analog-front-end (AFE) 102 that may be coupled to a sample circuit 104. The sample circuit 104 may be coupled to a digital receiver 106 that may be coupled back to the sample circuit 104. In addition, system 100 may include a phase locked loop (PLL) 108 that may be coupled to the sample circuit 104.

Each of the AFE 102, sample circuit 104, digital receiver 106, and PLL 108 may be a separate circuit, a system on chip (SOC), firmware, a processor(s), or other system not listed, or any combination thereof.

In operation, the AFE 102 may receive a continuous-time signal (z(t)) 110 and perform processing such as analog filtering and applying a gain to produce a continuous-time signal x(t) 112. In addition, the PLL 108 may operate to produce a clock signal (c) 116.

The sample circuit 104 may receive the continuous-time signal x(t) 112, the PLL clock signal (c) 116, and a phase control value 120. The sample circuit may also generate a phase shifted sample sequence $x_k$ 114 and a phase shifted clock signal (ĉ) 118 using a hybrid timing recovery approach. Additional details of the operation of an example embodiment of the sample circuit 104 are provided below with respect to FIG. 2.

The digital receiver 106 may receive the phase shifted sample sequence $x_k$ 114 and the phase shifted clock signal (ĉ) 118. The digital receiver 106 may then process the phase shifted sample sequence $x_k$ 114 using the phase shifted clock signal (ĉ) 118. In addition, the digital receiver 106 may determine or estimate a deviation of the phase of the clock signal from a target phase and may use it to adjust the desired phase, and return the desired phase to the sample circuit 104 as the phase control value 120. In some embodiments, the digital receiver 106 may be agnostic to the hybrid timing recovery approach of the sample circuit 104 and there may be no limit to the magnitude of the allowed phase control value 120 changes.

Figure 2:
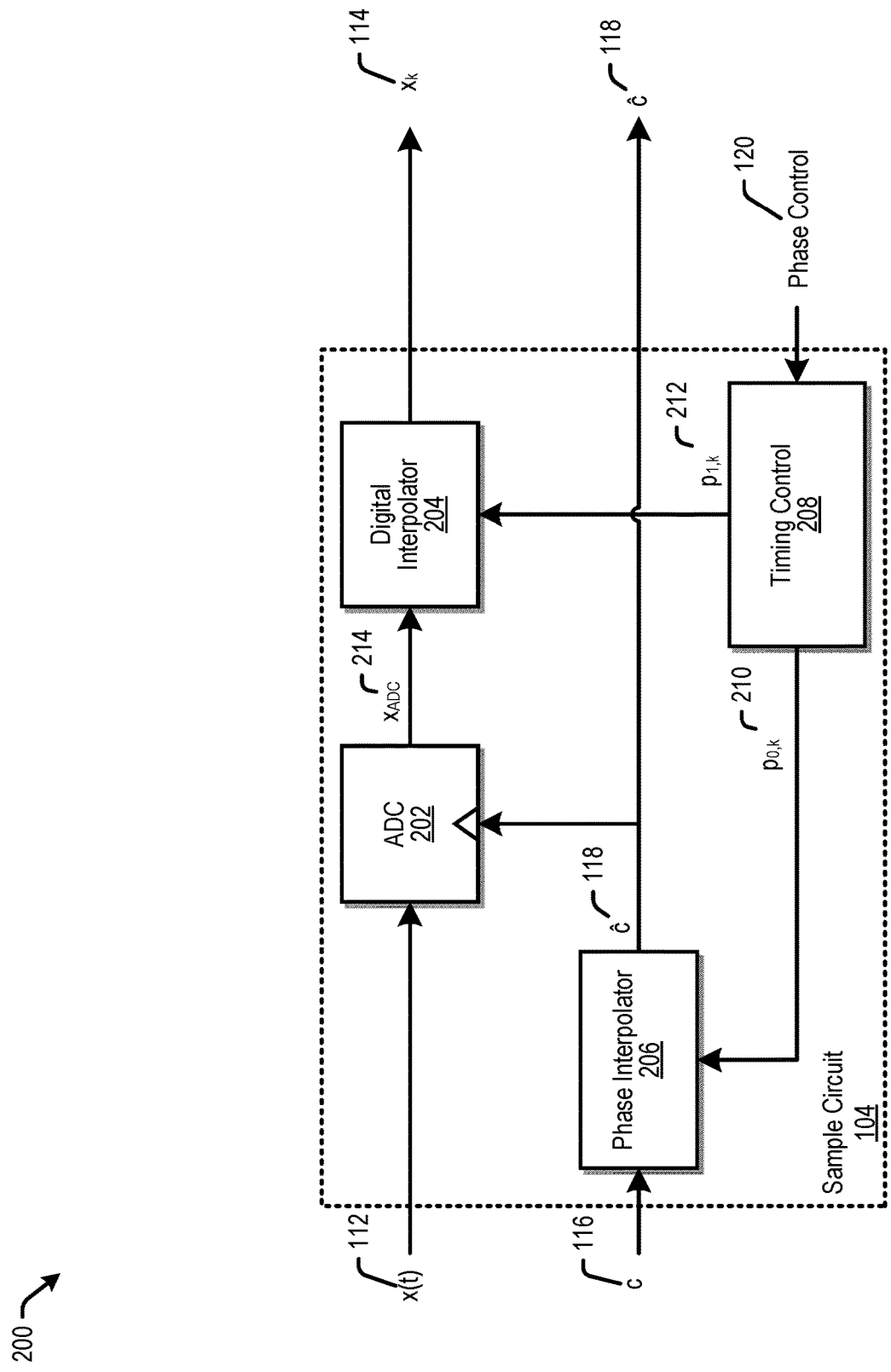
FIG. 2 is a block diagram of a sample circuit for a communication channel which includes hybrid timing recovery functionality, in accordance with certain embodiments of the present disclosure.

Referring to FIG. 2, a block diagram of the sample circuit 104 of the communication channel system 100 which may include hybrid timing recovery functionality is shown and is generally designated 200. The sample circuit 104 of FIG. 2 may include an analog-to-digital converter (ADC) 202 that may be coupled to a digital interpolator 204. The sample circuit 104 may also include a phase interpolator 206 that may be coupled to the ADC 202. In addition, the sample circuit 104 may include a timing control circuit 208 that may be coupled to the digital interpolator 204 and the phase interpolator 206.

Each of the ADC 202, digital interpolator 204, phase interpolator 206, and timing control circuit 208 may be a separate circuit, a system on chip (SOC), firmware, a processor(s), or other system not listed, or any combination thereof.

In general, the components of the sample circuit 104 may operate as follows.

The timing control circuit 208 may generate control signals $p_{0,k}$ 210 and $p_{1,k}$ 212 based on the phase control 120 and output control signals $p_{0,k}$ 210 and $p_{1,k}$ 212 to the digital interpolator 204 and the phase interpolator 206.

The phase interpolator 206 may receive the clock signal c 116 from the PLL 108 and the phase interpolator control signal $p_{o,k}$ and generate a phase shifted clock signal (ĉ) 118 based thereon. In some examples, the phase interpolator 206 may be circuit that may adjust the phase of an input clock signal.

The ADC 202 may receive the continuous-time signal x(t) 112 and the phase shifted clock signal (ĉ) 118. The ADC 202 may sample and quantize the continuous-time signal x(t) 112 at intervals based on the phase shifted clock signal (ĉ) 118 to produce a digitized sequence of samples $x_{ADC}$ 214.

The digital interpolator 204 may receive the digitized sequence of samples $x_{ADC}$ 214 and the digital interpolator control signal $p_{1,k}$ 212. The digital interpolator 204 may perform digital interpolation of the digitized sequence of samples $x_{ADC}$ 214 based on the digital interpolator control signal $p_{1,k}$ 212 to generate the phase shifted sample sequence $x_k$ 114. In some examples, the digital interpolator 206 may be a circuit that may phase shift samples digitally.

As mentioned above, the timing control circuit 208 may control the phase interpolator 206 to step the sampling clock of the ADC (e.g. the phase shifted clock signal (ĉ) 118) to the phase control value 120 (e.g. over multiple samples) while controlling the digital interpolator 204 to digitally interpolate the digitized sequence of samples $x_{ADC}$ 214 output by the ADC to recover for the remaining phase difference between the phase step size and the phase control value 120. As mentioned above, the phase shifted clock signal (ĉ) 118 may be changed in increments of the phase step size because there may be a maximum phase change that can be applied to the phase interpolator 206 without causing timing issues in the logic of the digital receiver 106. In some such examples, the phase step size may be any value greater than zero (0) and less than or equal to the maximum phase change that can be applied by the phase interpolator 206 without causing timing issues in the logic of the digital receiver.

In addition, in some examples, the timing control circuit 208 may compensate for a latency (D) between when the phase interpolator control signal $p_{0,k}$ is changed and when the change is reflected in the digitized sequence of samples $x_{ADC}$ 214. Specifically, the generation of the digital interpolator control signal $p_{1,k}$ 212 may compensate for the latency (D). In particular, because the digital interpolator control signal $p_{1,k}$ may change the phase of the phase shifted sample sequence $x_k$ 114 without delay, the timing control circuit 208 may generate the digital interpolator control signal $p_{1,k}$ such that the effect of the latency in the effect of the phase interpolator control signal $p_{0,k}$ is eliminated. An example of the operation of the timing control module in such an embodiment is illustrated in FIG. 3.

Figure 3:
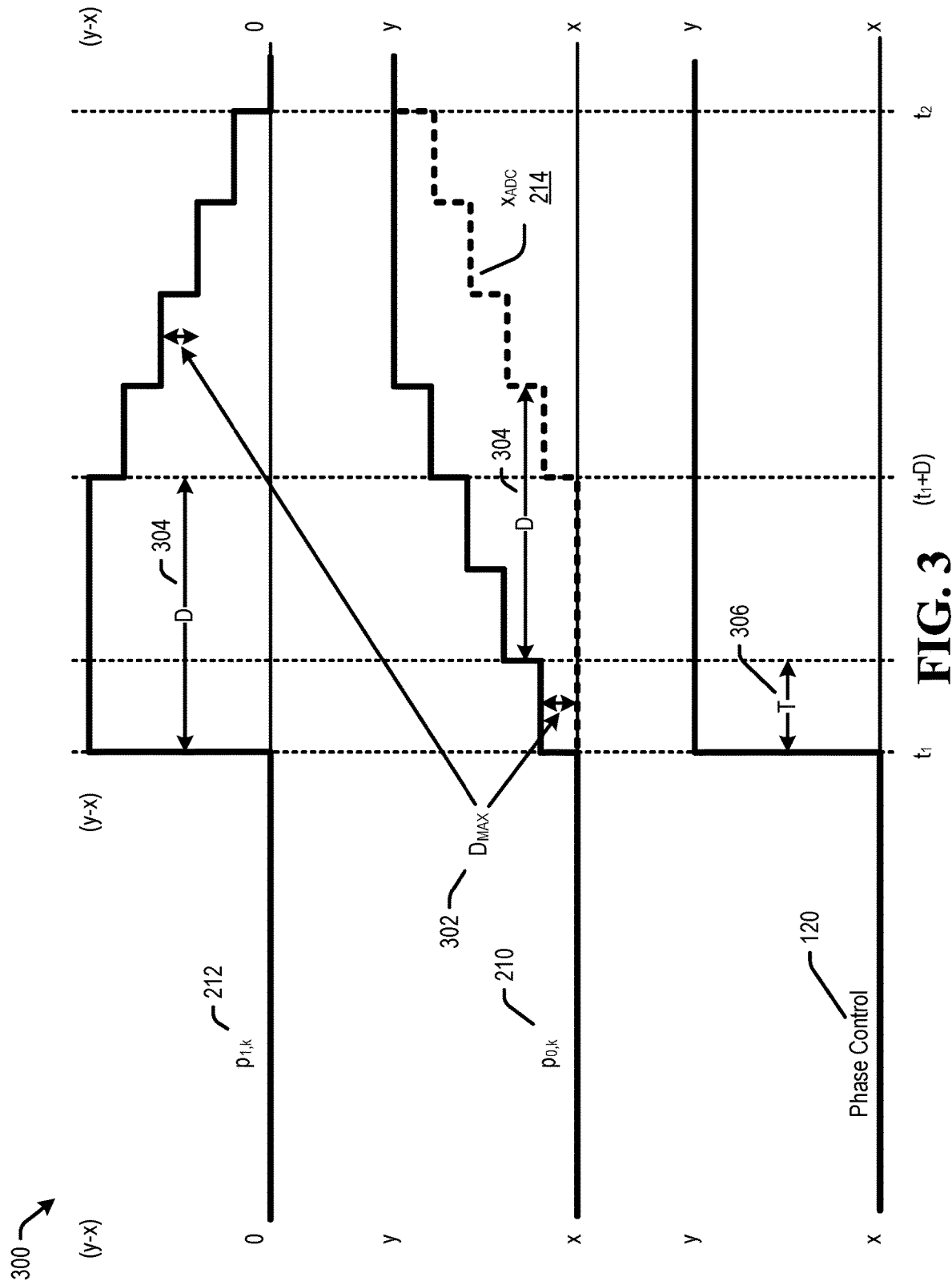
FIG. 3 illustrates example operations of a timing control circuit during a timing recovery process, in accordance with certain embodiments of the present disclosure.

FIG. 3 illustrates example operations of a timing control circuit 208 during a timing recovery process, in accordance with certain embodiments of the present disclosure. In particular, FIG. 3 illustrates a timing chart of the values of the input to the timing control circuit 208, specifically the phase control value 120, and the outputs of the timing control circuit 208, namely control signals $p_{0,k}$ 210 and $p_{1,k}$ 212. In some examples according to FIG. 3, the phase control may be assumed to specify the desired sampling phase which may maximize the signal folding at the sampling rate. The phase that provides the maximum signal folding may be the best phase for sampling. In other words, optimal samples may be provided when $p_{0,k}$ 210 is equal to the phase control value 120. However, due to latency in the ADC and the limit on the maximum change of the phase interpolator control signal $p_{0,k}$ 210 without causing errors in the digital logic, systems may not be able to immediately change $p_{0,k}$ 210 to the phase control value. In such situations, some examples according to FIG. 3 may step the phase interpolator control signal $p_{0,k}$ 210 to the phase control value 120 over multiple cycles and may utilize the digital interpolator to digitally interpolate samples to the phase of the phase control value 120 without delay.

As shown, the phase control value 120 may change from a value x to a value y at time $t_1$. In the illustrated example, the phase control value 120 may change by y−x, where (y−x) greater than the phase step size $D_{MAX}$ 302 for the phase interpolator control signal $p_{0,k}$ 210. Further, in the illustrated example, before time $t_1$, $p_{0,k}$=x and $p_{1,k}$=0 and, therefore, the continuous input signal may be sampled at the phase x. At time $t_1$, the phase control value 120 generated by the digital receiver changes from x to y. In response, the timing control circuit 208 may immediately change the digital interpolator control signal $p_{1,k}$ 212 to (y−x) and may begin slewing or stepping the phase interpolator control signal $p_{0,k}$ 210 at the rate of $D_{MAX}$ 302 (e.g. the phase step size) per sample period (T) 306. In some examples, each sample period may correspond to a clock cycle of phase shifted clock signal (ĉ) 118. In other examples, the phase may be stepped on a per period basis that may include multiple samples per period (e.g. on a per four sample basis). In FIG. 3, two lines are shown in the $p_{0,k}$ timing diagram. In particular, the solid line in the $p_{0,k}$ timing diagram may show the value of the phase interpolator control signal $p_{0,k}$ 210 and the dashed line may show the effect of the phase interpolator control signal $p_{0,k}$ 210 on the ADC output (e.g. on samples $x_{ADC}$ 214). As also shown, the effect of the phase interpolator control signal $p_{0,k}$ 210 on the samples $x_{ADC}$ 214 is delayed by latency (D) 304 from the time that the phase interpolator control signal $p_{0,k}$ 210 is changed. As such, at time or sample period ($t_1$+D), the change in the phase interpolator control signal $p_{0,k}$ 210 may start to take effect on the samples $x_{ADC}$ 214.

In addition, as the change in the phase interpolator control signal $p_{0,k}$ 210 starts to take effect on the samples $x_{ADC}$ 214 and assuming the phase control value 120 does not change, the timing control circuit 208 may begin to step the digital interpolator control signal $p_{1,k}$ 212 downwards to ensure that the total effective phase shift in the phase shifted sample sequence $x_k$ 114 is equal to the phase control value 120. By time $t_2$, the value of the phase interpolator control signal $p_{0,k}$ 210 may equal the phase control value 120, specifically y, and $p_{1,k}$ 212 may equal zero.

As demonstrated by the example of FIG. 3, the timing control circuit 208 may drive the phase interpolator control signal $p_{0,k}$ 210 and, by extension, the sampling phase of the ADC, to the point of constructive folding as quickly as possible within the constraints of the phase step size and any latency (D) between the application of $p_{0,k}$ 210 and its effect on the ADC output (e.g. $x_{ADC}$ 214). In some cases, due to the latency (D) between the change of $p_{0,k}$ 210 and its effect on the ADC output (e.g. $x_{ADC}$ 214), the value of $p_{1,k}$ 212 may be non-zero even when changes in phase control value 120 are smaller than $D_{MAX}$. This may ensure that the change in the value of phase control value 120 may be instantaneously reflected in the value of the phase shifted sample sequence $x_k$ generated for application to the digital receiver 106.

As illustrated by the example in FIG. 3, the timing control circuit 208 may operate to distribute the phase control value 120, denoted by $P_k$ at time k below, between to the two phase control signals $p_{0,k}$ and $p_{1,k}$. In some embodiments, $P_k$ may take on a value in the set {0, 1, . . . , N−1} of phases and may wrap in value since the clock edge may advance in time. For example, when $P_k$=N−1 and $P_{k+1}$=0, the clock edges may be separated by (1+1/N)T).

As mentioned above, the timing control circuit 208 may operate such that, at each time or sample period k, the effective phase used to generate a sample ($x_k$) is equivalent to the phase control value ($P_k$) and the phase of the sampling clock, as specified by the phase interpolator control signal $p_{0,k}$ 210 to the phase interpolator, may step to the value of the current phase control value ($P_k$) as quickly as possible within the phase step size $D_{MAX}$ 302.

Due to the latency (D) 304 between when the $p_{0,k}$ 210 is specified and when it may be reflected in the ADC output $x_{ADC}$ 214, and because $p_{1,k}$ 212 may be used to impose an immediate phase shift at the digital interpolator, the effective phase ($P_{k,eff}$) for a period or time k may be determined by:

$$P_{k,eff}=(p_{0,k-D}+p_{1,k}). \quad (1)$$

where $p_{0,k-D}$ is the value of the phase interpolator control signal 210 from D sample periods before k. In some examples, the timing control circuit 208 may include a buffer (such as a delay line) storing the preceding D values of the phase interpolator control signal 210 if D is measured in sample periods or clock cycles. In other examples, the preceding D values of the phase interpolator control signal 210 may be stored in a memory outside of, and accessed by, the timing control module 208. As mentioned above, the timing control module 208 may determine the phase interpolator control signal $p_{0,k}$ 210 and the digital interpolator control signal $p_{1,k}$ 212 such that the effective phase $P_{k,eff}$ may be equal to the phase control value ($P_k$). This relationship may be express as:

$$P_{k,eff}=P_k=(p_{0,k-D}+p_{1,k}), \quad (2)$$

To effectuate this relationship, the timing control module 208 may determine the digital interpolator control signal $p_{1,k}$ as:

$$p_{1,k}=(P_k-p_{0,k-D}). \quad (3)$$

In some embodiments, when adjusting the value of the phase interpolator control signal $p_{0,k}$ 210, the timing control circuit 208 may first generate an error as follows:

$$e_k=(P_k-p_{0,k}). \quad (4)$$

Next, the timing control circuit 208 may determine which direction the adjustment to the phase interpolator control signal $p_{0,k}$ 210 should be applied to reach $P_k$ in the shortest period of time. For example, if the number of phases is 64 (e.g. N=64), the phase control value 120 is 55 (e.g. $P_k$=55), and the phase interpolator control signal is 6 (e.g. $p_{0,k}$=6), the error in (4) may be computed as (55−6)=49. Although the phase interpolator control signal $p_{0,k}$ may be adjusted by 49 to reach the phase control value, it is quicker to move the phase interpolator control signal $p_{0,k}$ by (49−64)=−15. As such, the timing control circuit 208 may unwrap the error. If, for example, the phase control value $P_k=10$ and the phase interpolator control signal $p_{0,k}=63$, the error $e_k$ may be determined as $(10-63)=-53$, which may in turn be unwrapped as $(64-53)=11$. The resulting unwrapped error is then saturated to the phase step size if the unwrapped error is greater than the phase step size). The saturated unwrapped error may then be used to adjust the phase interpolator control signal $p_{0,k}$ 210. The timing control module 208 may then compute the next value of $p_{1,k}$ as given by (3).

Figure 4:
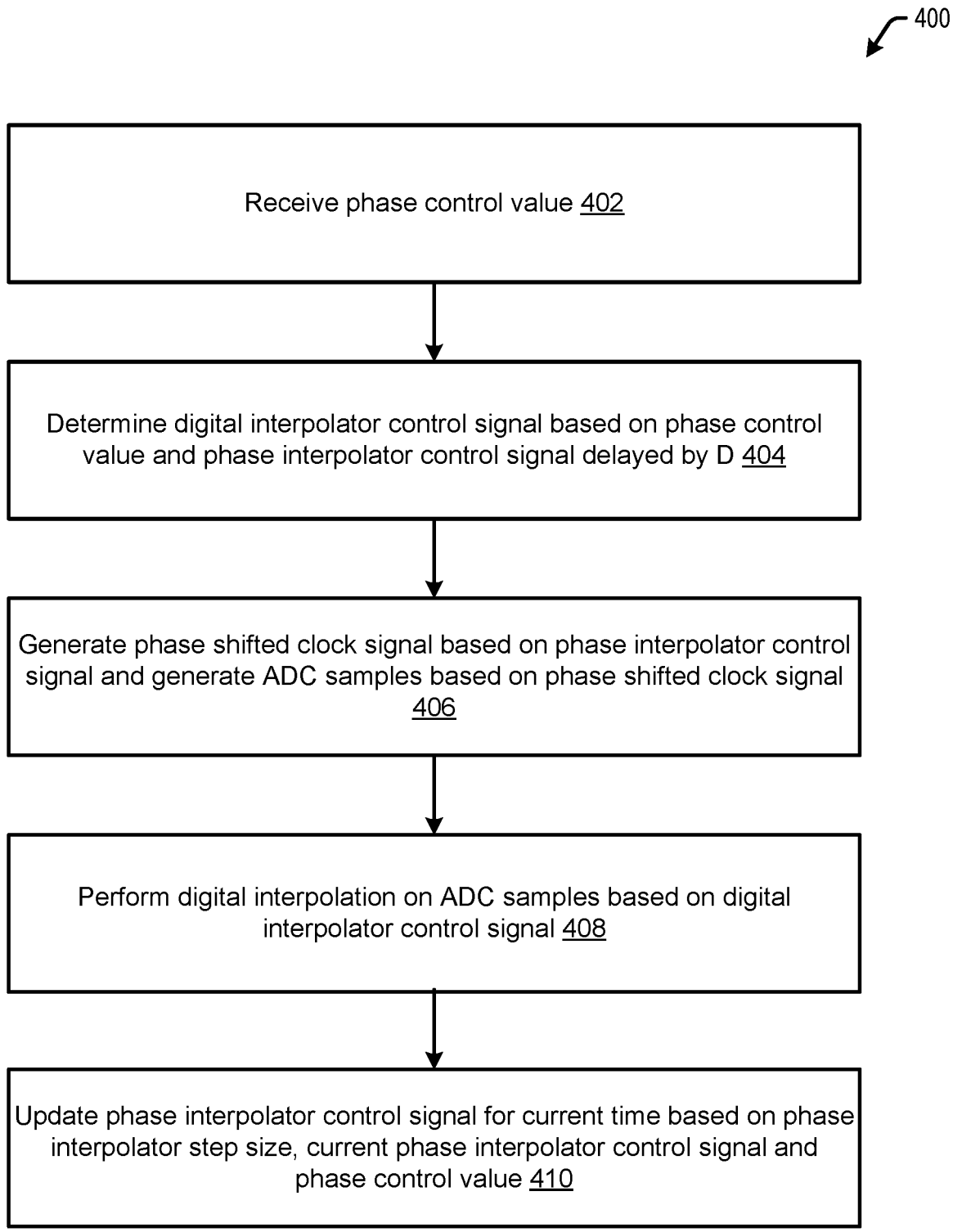
FIG. 4 is a flowchart of a method of hybrid timing recovery functionality, in accordance with certain embodiments of the present disclosure.
Figure 5:
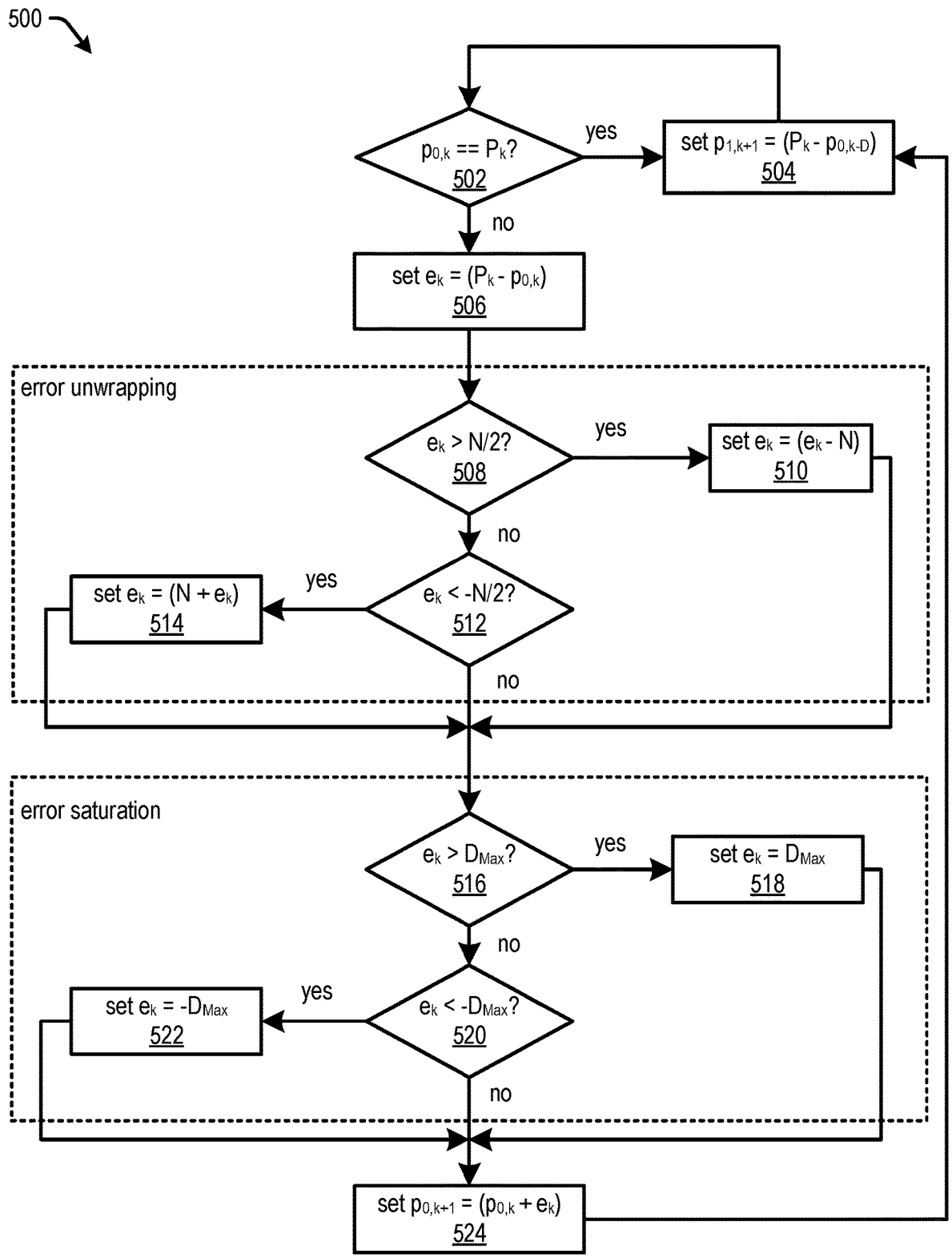
FIG. 5 is a flowchart of a method of hybrid timing recovery functionality, in accordance with certain embodiments of the present disclosure.

FIGS. 4 and 5 illustrate an example process for the operation of the sample circuit 104 and timing control circuit 208.

Referring to FIG. 4, a flowchart of a method of hybrid timing recovery is shown and is generally designated 400. More particularly, flowchart 400 may be a general flow of operations of the sample circuit 104 detailed above with respect to FIGS. 1-3.

In operation, the system may receive a phase control value at 402. For example, the system may receive a phase control value from a digital receiver which may represent a timing error in the samples most recently processed by the digital receiver. At 404, the timing control circuit may determine a digital interpolation control signal based on the phase control value and a phase interpolator control signal delayed by D (e.g. the delay between a time at which the timing control module may output a phase interpolator control signal and the time at which that output of the phase interpolator control signal may affect the samples output by an ADC). At 406, the system may generate a phase shifted clock signal based on phase interpolator control signal (due to inherent latency of the phase interpolator and ADC blocks, may be delayed by D relative to its current specified value) and generate ADC samples based on the phase shifted clock signal. The digital interpolator may then perform digital interpolation on the ADC samples based on the digital interpolation control signal at 408. Next, the timing control circuit may update the phase interpolator control signal for the current time based on phase step size, the current phase interpolator control signal and the phase control value at 410. A more detailed example embodiment of the logic of the timing control circuit is provided by FIG. 5.

Referring to FIG. 5, a flowchart of a method of hybrid timing recovery is shown and is generally designated 500. More particularly, flowchart 500 may be a flow of operations of the timing control circuit as detailed above with respect to FIGS. 1-4.

At 502, the timing control circuit may determine whether the phase interpolator control signal $p_{0,k}$ is equal to the phase control value $P_k$. If so, the process may continue to 504. Otherwise, the process may continue to 506. At 504, the timing control circuit may set the value of the $p_{1,k+1}$ to $(P_k-p_{0,k-D})$. The process may then return to 502 for the next $P_k$. At 506, the timing control circuit may determine the error value $e_k$ as $(P_k-p_{0,k})$ and continue to 508.

The timing control circuit may then perform error unwrapping. In particular, at 508, the timing control circuit may determine whether the error $e_k$ is greater than half the total number of phases (e.g. $e_k>N/2$?). If so, the process may continue to 510. Otherwise, the process may continue to 512. At 510, the timing control circuit may set the error $e_k$ to be $(e_k-N)$. The process may then continue to 516. At 512, the timing control circuit may determine whether the error $e_k$ is less than half the negative of the total number of phases (e.g. $e_k<-N/2$?). If so, the process may continue to 514. Otherwise, the process may continue to 516. At 514, the timing control circuit may set the error $e_k$ to be $(N+e_k)$. The process may then continue to 516.

The timing control circuit may then perform error saturation. In particular, at 516, the timing control circuit may determine whether the error $e_k$ is greater than the phase step size $D_{Max}$ (e.g. $e_k>D_{Max}$?). If so, the process may continue to 518. At 518, the timing control circuit may set the error $e_k$ to be the phase step size $D_{Max}$. The process may then continue to 524. At 520, the timing control circuit may determine whether the error $e_k$ is less than the negative of the phase step size $D_{Max}$ (e.g. $e_k<-D_{Max}$?). If so, the process may continue to 522. Otherwise, the process may continue to 524. At 522, the timing control circuit may set the error $e_k$ to be the negative of the phase step size $-D_{Max}$. The process may then continue to 524.

At 524, the timing control circuit may use the unwrapped and saturated error to determine $p_{0,k+1}$ as $p_{0,k}+e_k$. The process may then return to 506 as discussed above.

All steps listed for the methods 400 and 500 may be applied to synchronous timing systems. Many variations would be apparent in view of this disclosure. Components and circuits used to perform the operations in the method may be discrete, integrated into a system on chip (SOC), or other circuits. Further, the steps can be carried out in a processor (e.g. a digital signal processor), implemented in software, implemented via firmware, or by other means.

Figure 6:
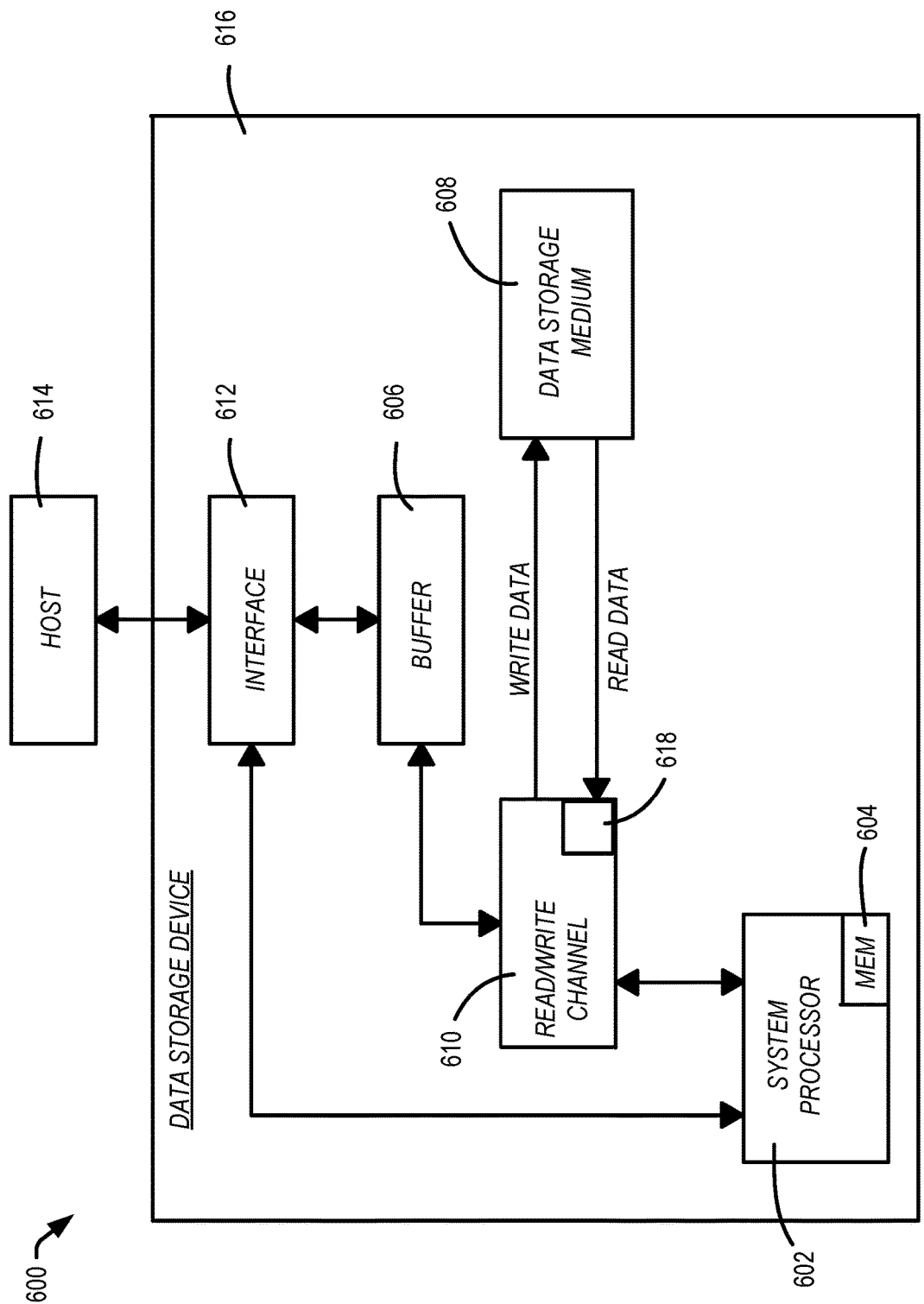
FIG. 6 is a block diagram of a system including hybrid timing recovery functionality, in accordance with certain embodiments of the present disclosure.

Referring to FIG. 6, a block diagram of a system including hybrid timing recovery is shown and generally designated 600. The system 600 can be an example of a data storage device (DSD), and may be an example implementation of system 100. The DSD 616 can optionally connect to and be removable from a host device 614, which can be a device or system having stored data, such as a desktop computer, a laptop computer, a server, a digital video recorder, a photocopier, a telephone, a music player, other electronic devices or systems not listed, or any combination thereof. The data storage device 616 can communicate with the host device 614 via the hardware/firmware based host interface circuit 612 that may include a connector (not shown) that allows the DSD 616 to be physically connected and disconnected from the host 614.

The DSD 616 can include a system processor 602, which may be a programmable controller, and associated memory 604. The system processor 602 may be part of a system on chip (SOC). A buffer 606 may temporarily store data during read and write operations and can include a command queue. The read/write (R/W) channel 610 can encode data during write operations to, and reconstruct data during read operations from, the data storage medium 608. The data storage medium 608 is shown and described as a hard disc drive, but may be other types of magnetic medium, such as a flash medium, optical medium, or other medium, or any combination thereof.

The R/W channel 610 may receive data from more than one data storage medium at a time, and in some embodiments can also receive multiple data signals concurrently, such as from more than one output of a read head. For example, storage systems having two-dimensional magnetic recording (TDMR) systems can have multiple reading or recording elements, and can read from two tracks simultaneously or nearly simultaneously. Multi-dimensional recording (MDR) systems can receive two or more inputs from multiple sources (e.g. recording heads, flash memory, optical memory, and so forth). The R/W channel 610 can combine multiple inputs and provide a single output, as described in examples herein.

The block 618 can implement all of or part of the systems and functionality of systems and methods 100-500. In some embodiments, the block 618 may be a separate circuit, integrated into the R/W channel 610, included in a system on chip, firmware, software, or any combination thereof.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, the figures and above description provide examples of architecture that may be varied, such as for design requirements of a system. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
   a circuit configured to:
      receive a first phase control value of a phase control value signal;
      generate a first phase interpolator control signal value of a phase interpolator control signal;
      generate a first digital interpolator control signal value of a digital interpolator control signal;
      phase interpolate a clock signal based on the first phase interpolator control signal value to produce a phase shifted clock signal; and
      digitally interpolate a digital sample based on the first digital interpolator signal value to produce a phase shifted digital sample having an effective phase based on the first phase control value, the digital sample generated using the phase shifted clock signal as a sample clock.

2. The apparatus of claim 1, further comprising the circuit further including an analog-to-digital converter (ADC) and the ADC being configured to sample an input signal based on the phase shifted clock signal to produce digital samples including the digital sample.

3. The apparatus of claim 2, further comprising the circuit further configured to perform the generation of the phase interpolator control signal by stepping the phase interpolator control signal on a per period basis toward the current value of the phase control value signal for a current sample period.

4. The apparatus of claim 3, further comprising the circuit further configured to perform the stepping of the phase interpolator control signal toward the current phase control value by:
   determining a difference between a current value of the phase interpolator control signal and the current phase control value;
   performing error unwrapping on the difference to produce an unwrapped difference; and
   performing error saturation on the unwrapped difference based on a phase step size to produce an unwrapped saturated difference; and
   updating the current value of the phase interpolator control signal based on the unwrapped saturated difference and the current value of the phase interpolator control signal.

5. The apparatus of claim 3, further comprising:
   a phase interpolator that performs the phase interpolation of the clock signal based on the phase interpolator control signal to produce the phase shifted clock signal;
   the first phase interpolator control value being generated based on a second phase control value received in a first sample period a delay period before a second sample period in which the first phase control value was received.

6. The apparatus of claim 3 further comprising:
   a buffer that buffers phase interpolator control signal values for at least a delay period;
   a digital interpolator that performs the digital interpolation of digital samples generated by the ADC based on the digital interpolator signal to produce phase shifted digital samples, the digital interpolator signal being generated based on a difference of a current phase control value and a phase interpolator control signal value generated in a sample period a delay period before a first current sample period.

7. The apparatus of claim 6, further comprising a digital receiver that processes the phase shifted digital samples, a logic of the digital receiver being clocked based on the phase shifted clock signal.

8. The apparatus of claim 1, further comprising the digital receiver being one of a decoder, a filter or a detector.

9. The apparatus of claim 1, further comprising the digital receiver further configured to generate the phase control signal.

10. A system comprising:
    a timing control circuit configured to:
       receive a first phase control value of a phase control signal;
       generate a phase interpolator control signal based on the phase control signal;
       generate a first digital interpolator control signal value of a digital interpolator control signal based on the phase control signal;
    a phase interpolator that phase interpolates a clock signal based on the phase interpolator control signal to produce a phase shifted clock signal; and
    a digital interpolator that digitally interpolates digital samples based on the digital interpolator signal to produce phase shifted digital samples; a first digital sample of the digital samples being interpolated based on a first digital interpolator control value of the digital interpolator control signal to produce a first phase shifted digital sample having an effective phase based on the first phase control value, the digital samples being generated using the phase shifted clock signal as a sample clock.

11. The system of claim 10 further comprising:
    an analog-to-digital converter (ADC) configured to sample an input signal based on the phase shifted clock signal to produce the digital samples.

12. The system of claim 11 further comprising the timing control circuit further configured to:

perform the generation of the phase interpolator control signal by stepping the phase interpolator control signal on a per period basis toward the current value of the phase control value signal for a current sample period.

13. The system of claim 12 further comprising the timing control circuit further configured to perform the stepping of the phase interpolator control signal toward the current phase control value by:
   determining a difference between a current value of the phase interpolator control signal and the current phase control value;
   performing error unwrapping on the difference to produce an unwrapped difference;
   performing error saturation on the unwrapped difference based on a phase step size to produce an unwrapped saturated difference; and
   updating the current value of the phase interpolator control signal based on the unwrapped saturated difference and the current value of the phase interpolator control signal.

14. The system of claim 12 further comprising:
   a first phase interpolator control value being generated based on a second phase control value received in a first sample period a delay period before a second sample period in which the first phase control value was received;
   and the first digital sample being generated using the phase shifted clock signal as phase interpolated using the first phase interpolator control value as a sample clock.

15. The system of claim 12 further comprising:
   a buffer that buffers values of the phase interpolator control signal for at least a delay period; and
   the digital interpolator signal being generated based on a difference of a current phase control value and a phase interpolator control signal value generated the delay period before a current sample period.

16. The system of claim 10 further comprising a digital receiver that processes the phase shifted digital samples, a logic of the digital receiver being clocked based on the phase shifted clock signal and the digital receiver being configured to generate the phase control signal.

17. A method comprising:
   receiving, by a timing control circuit, a first phase control value of a phase control value signal;
   generating, by the timing control circuit, a first phase interpolator control signal value of a phase interpolator control signal;
   generating, by the timing control circuit, a first digital interpolator control signal value of a digital interpolator control signal;
   phase interpolating a clock signal based on the first phase interpolator control signal value to produce a phase shifted clock signal; and
   digitally interpolating a digital sample based on the first digital interpolator signal to produce a phase shifted digital sample having an effective phase based on the first phase control value, the digital sample generated using the phase shifted clock signal as a sample clock.

18. The method of claim 17 further comprising
performing the generation of the phase interpolator control signal by stepping the phase interpolator control signal on a per period basis toward the current value of the phase control value signal for a current sample period by:
   determining a difference between a current value of the phase interpolator control signal and the current phase control value;
   performing error unwrapping on the difference to produce an unwrapped difference;
   performing error saturation on the unwrapped difference to produce a unwrapped saturated difference; and
   updating the current value of the phase interpolator control signal based on the unwrapped saturated difference and the current value of the phase interpolator control signal.

19. The method of claim 18 further comprising generating the first phase interpolator control value based on a second phase control value received in a sample period a delay period before the first phase control value.

20. The method of claim 19 further comprising generating the digital interpolator signal based on a difference of the first phase control value and the first phase interpolator control signal value.

* * * * *